(12) United States Patent
Tsai et al.

(10) Patent No.: US 9,136,149 B2
(45) Date of Patent: Sep. 15, 2015

(54) LOADING PORT, SYSTEM FOR ETCHING AND CLEANING WAFERS AND METHOD OF USE

(71) Applicant: TAIWAN SEMICONDUCTOR MANUFACTURING COMPANY, LTD., Hsinchu (TW)

(72) Inventors: Wen-Chang Tsai, Hsinchu (TW); Shao-Yen Ku, Jhubei (TW); Hsieh-Ching Wei, Hsinchu (TW); Yuan Chih Chiang, Hsinchu (TW); Jui-Chuan Chang, Hsinchu (TW); Yung-Li Tsai, Houlong Town (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 13/679,198

(22) Filed: Nov. 16, 2012

(65) Prior Publication Data

US 2014/0141541 A1    May 22, 2014

(51) Int. Cl.
| H01L 21/677 | (2006.01) |
| H01L 21/00 | (2006.01) |
| H01L 21/67 | (2006.01) |
| H01L 21/673 | (2006.01) |

(52) U.S. Cl.
CPC .... *H01L 21/67253* (2013.01); *H01L 21/67017* (2013.01); *H01L 21/67023* (2013.01); *H01L 21/67028* (2013.01); *H01L 21/67063* (2013.01); *H01L 21/6773* (2013.01); *H01L 21/67242* (2013.01); *H01L 21/67389* (2013.01); *H01L 21/67766* (2013.01); *H01L 21/67769* (2013.01); *H01L 21/67775* (2013.01); *H01L 21/67069* (2013.01); *H01L 21/67075* (2013.01); *H01L 21/67265* (2013.01)

(58) Field of Classification Search
CPC .................................................. H01L 21/67769
USPC .......................................................... 414/935
See application file for complete search history.

(56) References Cited

U.S. PATENT DOCUMENTS

| 6,343,882 B1 * | 2/2002 | Chang et al. ................... 396/611 |
| 2002/0009813 A1 * | 1/2002 | Deguchi ............................ 438/5 |

(Continued)

FOREIGN PATENT DOCUMENTS

| JP | 2003-7799 | 1/2003 |
| KR | 1020040047303 | 6/2004 |
| KR | 100557302 | 2/2006 |

OTHER PUBLICATIONS

Office Action dated Dec. 26, 2013 with English abstract from corresponding application No. 10-2013-0022492.

(Continued)

*Primary Examiner* — Su C Kim
*Assistant Examiner* — Regan J Rundio
(74) *Attorney, Agent, or Firm* — Lowe Hauptman & Ham, LLP

(57) ABSTRACT

A loading port includes a housing and a plurality of stations defined in the housing configured to receive a front opening universal pod (FOUP). The loading port further includes a connector configured to receive an inert gas. At least one of the plurality of stations is configured to deliver the inert gas to the FOUP to purge an interior of the FOUP of moisture. A system including the loading port and a method of using the system are also described.

20 Claims, 5 Drawing Sheets

(56) References Cited

U.S. PATENT DOCUMENTS

| | | |
|---|---|---|
| 2003/0091410 A1 | 5/2003 | Larson et al. |
| 2004/0105738 A1 | 6/2004 | Ahn et al. |
| 2004/0187451 A1* | 9/2004 | Suzuki et al. ................ 55/385.1 |
| 2005/0111935 A1 | 5/2005 | Kim et al. |
| 2007/0093071 A1 | 4/2007 | Verhaverbeke et al. |
| 2008/0209890 A1* | 9/2008 | Cox et al. ........................ 60/286 |
| 2009/0062956 A1* | 3/2009 | Chen et al. .................... 700/214 |
| 2009/0067957 A1 | 3/2009 | Ando |
| 2010/0135753 A1 | 6/2010 | Natsume et al. |
| 2010/0143082 A1* | 6/2010 | Wang et al. .............. 414/222.02 |
| 2011/0114129 A1* | 5/2011 | Kishkovich et al. ......... 134/22.1 |
| 2012/0009764 A1* | 1/2012 | Ishibashi et al. .............. 438/478 |
| 2013/0013103 A1* | 1/2013 | Shibata ........................ 700/228 |

OTHER PUBLICATIONS

Office Action dated Apr. 21, 2015 from corresponding No. TW 102140631.

* cited by examiner

LOADING PORT, SYSTEM FOR ETCHING AND CLEANING WAFERS AND METHOD OF USE

BACKGROUND

Processing wafers used to form semiconductor devices includes several etching and cleaning processes to form features of the semiconductor device on the wafers. The etching processes involve removal of material either directly from the wafers or from layer formed on the wafers. The etching processes leave behind residual material which is removed during the cleaning processes. In an interval between an etching process and a cleaning process, moisture from a surrounding atmosphere reacts with the residual materials and forms compounds which cause damage to the wafers or the layers on the wafers, in some instances. For example, in an etching process using tetrafluoromethane ($CF_4$) as the etchant, the residual material may include cryptohalite (($NH_4)_2SiF_6$). Cryptohalite reacts with moisture in the form of water vapor to produce ammonia ($NH_3$) and hydrofluoric acid (HF). The ammonia and hydrofluoric acid will remove material from the wafer and layers formed on the wafer, in some instances.

In order to reduce the impact of the residual materials, the wafers are transferred from the etching process to an intermediate process which uses nitrogen gas to reduce the moisture content around the etched wafers. The lower moisture content decreases the chance of reactions between the residual material and the moisture creating damaging compounds. However, the time required to transfer the wafers to the intermediate process increases the production time for creating the semiconductor device. In some instances, a time between the intermediate process and the cleaning process is sufficiently long to allow the moisture content in the atmosphere around the wafers to increase to a point where damaging compounds are formed on a surface of the wafers resulting in damage to the wafers and potentially rendering the wafers unusable.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry, various features may not be drawn to scale and are used for illustration purposes only. In fact, the dimensions of the various features in the drawings may be arbitrarily increased or reduced for clarity of discussion. Reference is made to the drawings in which.

DETAILED DESCRIPTION

The following disclosure provides many different embodiments, or examples, for implementing different features of the invention. Specific examples of components and arrangements are described below to simplify the present disclosure. These are examples and are not intended to be limiting.

Figure 1:
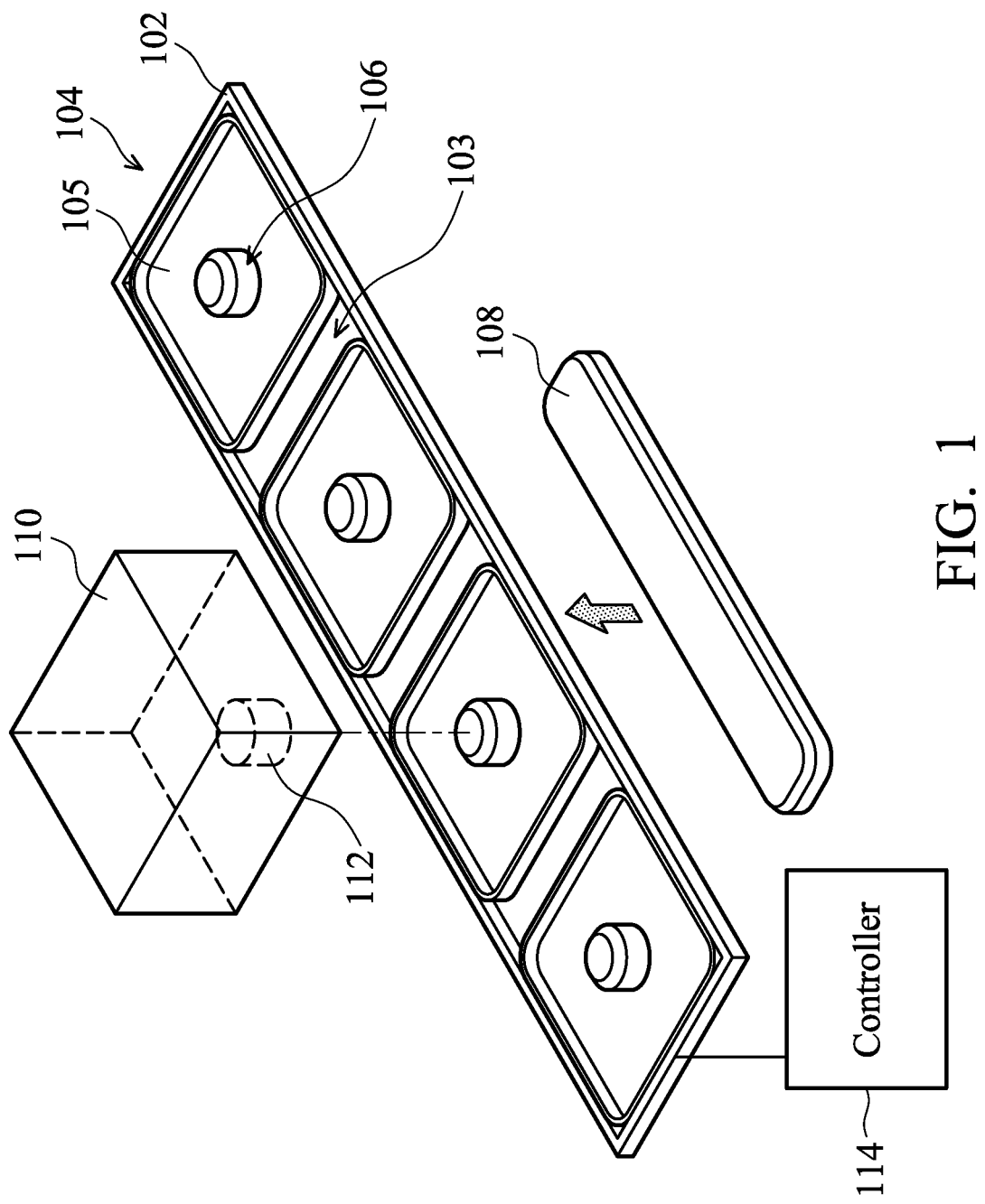
FIG. 1 is a perspective view of a loading port of and a front opening universal pod (FOUP) in accordance with one or more embodiments.

FIG. 1 is a perspective view of a loading port 100. Loading port 100 includes a housing 102 having a support plate 103 and a plurality of stations 104, each station 104 is configured to receive a front opening universal pod (FOUP) 110, so that the FOUP rests on support plate 103. Each station includes guiding walls 105 configured to facilitate accurate placement of FOUP 110. Each station 104 also includes a nozzle 106 configured to engage with FOUP 110. FOUP 110 includes a valve 112 to connect with nozzle 106. In some embodiments, less than every station 104 includes nozzle 106. Loading port 100 also includes a gas supply 108 and a controller 114.

Housing 102 is configured to provide structural support for FOUPs 110 located at stations 104. Housing 102 also helps to protect FOUPs 110 at stations 104 and nozzles 106 at stations 104 not occupied by FOUP 110 from damage from exterior components during semiconductor device manufacturing. Housing 102 includes support plate 103. In some embodiments, housing 102 includes walls (not shown) surrounding support plate 103. In some embodiments including walls, housing 102 has an open side facing a device into which wafers from loading port 100 are to be loaded.

Each station 104 is configured to receive FOUP 110. Stations 104 include guiding walls 105 raised above support plate 103 to guide placement of FOUP 110. In some embodiments, stations 104 include guiding walls 105 recessed into support plate 103 to guide placement of FOUP 110. In some embodiments, guiding walls 105 are omitted so that stations 104 include a flat support surface of housing 102.

Nozzles 106 are configured to supply inert gas from gas supply 108 to valve 112 of FOUP 110. Controller 114 is connected to nozzles 106 to regulate a flow of inert gas. In some embodiments, nozzles 106 protrude above support plate 103. In some embodiments, nozzles 106 are recessed with respect to the top surface of housing 102. Nozzles 106 are located at a center of each station 104. In some embodiments, nozzles 106 are located off-center with respect to each station 104.

Gas supply 108 is configured to store inert gas and to provide the inert gas to nozzles 106. In some embodiments, each loading port 100 includes a separate gas supply 108. In some embodiments, a single gas supply 108 is shared by more than one loading port 100. In some embodiments, gas supply 108 is located at a single location and supply lines connect the gas supply to each loading port. In some embodiments, gas supply 108 is removable from loading port 100 to facilitate replacement of an empty or damaged inert gas supply 108. In some embodiments, gas supply 108 is integral with loading port 100 and the gas supply is recharged while attached to the loading port. The inert gas is nitrogen gas (N2). In some embodiments, the inert gas is argon (Ar), neon (Ne) or other suitable inert gases.

FOUP 110 is configured to transport wafers between various devices used during the manufacturing of semiconductor devices. FOUP 110 includes fins protruding from interior sidewalls which hold the wafers in place. In some embodiments, FOUP 110 is capable of storing up to 25 wafers at a time. In some embodiments, FOUP 110 is capable of storing more or less than 25 wafers at a time. FOUP 110 is configured to facilitate insertion and removal of wafers through a front opening door. In some embodiments, a robotic handling system is used to insert and remove wafers from FOUP 110. FOUP 110 has a controlled interior environment to help maintain a low moisture content within the FOUP and to reduce the risk of contaminating particles adhering to wafers stored within the FOUP.

FOUP 110 is moved between stations 104 of loading port 100 in a queue format such that a first FOUP to enter the loading port is the first FOUP to exit the loading port. In some embodiments, the robotic handling system is configured to move FOUP 110 between stations 104. In some embodiments, FOUP 110 is moved between stations using a conveyor belt, a transport vehicle or other suitable means.

Valve 112 is located in the bottom surface of FOUP 110. In some embodiments, valve 112 is located in a back surface of FOUP 110 opposite the front opening door, or another suitable surface of the FOUP. Valve 112 is configured to convey inert gas from inert gas supply 108 through nozzle 106 to the interior of FOUP 110. The inert gas increases a pressure inside FOUP 110 to a pressure greater than the exterior pressure. The pressure gradient forces moisture out of the interior of FOUP 110 and prevents moisture from reentering the FOUP. Over time, the pressure gradient decreases as a result of leakage of gas from FOUP 110 and moisture content begins to reenter the FOUP.

Loading port 100 includes controller 114 configured to monitor a length of time since a previous purge of FOUP 110. When the time exceeds a refresh time, controller 114 sends a signal to nozzle 106 to allow inert gas to flow into FOUP 110 to purge an interior of the FOUP with the inert gas. Controller 114 is also configured to receive a signal indicating whether a front opening door of FOUP 110 is open. If the front opening door of FOUP 110 is open, the FOUP is either loading or unloading wafers and controller 114 does not signal nozzle 106 to allow inert gas to flow. If the front opening door of FOUP 110 is closed, controller 114 signals nozzle 106 to purge the interior of the FOUP with inert gas. In some embodiments, each loading port 100 includes an individual controller 114. In some embodiments, controller 114 is shared by more than one loading port 100.

Figure 2:
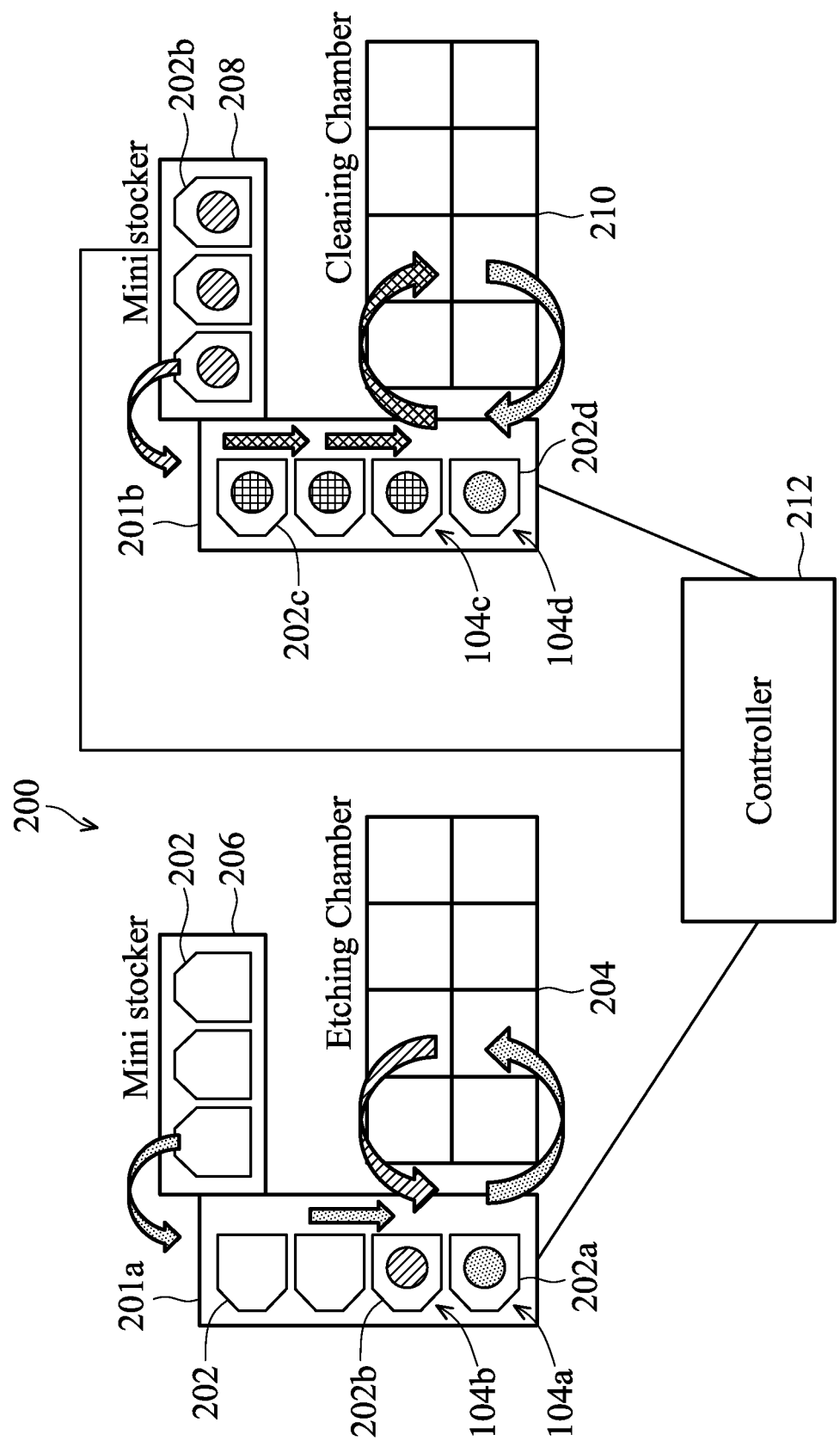
FIG. 2 is a functional diagram of a wafer processing system for etching and cleaning wafers including the loading port of FIG. 1 in accordance with one or more embodiments.

FIG. 2 is a diagram of a wafer processing system 200 for etching and cleaning wafers including loading ports 201. System 200 includes a loading port 201a which houses FOUPs 202. In some embodiments, loading port 201a is the same as loading port 100 (FIG. 1). System 200 also includes an etching chamber 202 located adjacent a first end of loading port 201a. A mini-stocker 206 which houses FOUPs 202 is located adjacent a second end of loading port 201a. System 200 further includes a loading port 201b. A cleaning chamber 210 is located adjacent a first end of loading port 201b and a mini-stocker 208 is located adjacent a second end of loading port 201b. System 200 also includes a controller 212 configured to monitor a refresh time.

A wafer stored in FOUP 202a located at station 104a is loaded into etching chamber 204, where an etching process is performed on the wafer or on layers formed on the wafer. The etched wafer is transferred to FOUP 202b located at station 104b. Empty FOUPs 202 are stored in mini-stocker 206 attached to loading port 201a. In some embodiments, mini-stocker 206 is omitted. In some embodiments where mini-stocker 206 is omitted, loading port 201a includes more stations 104 (FIG. 1) than embodiments which include the mini-stocker. Once FOUP 202b contains a specified number of wafers, the front opening door of FOUP 202b is closed and the interior of the FOUP is purged with the inert gas. FOUP 202b is transferred from loading port 201a to mini-stocker 208. An empty FOUP 202 is transported to station 104b of loading port 201a previously occupied by FOUP 202b and another empty FOUP 202 from mini-stocker 206 is transferred to loading port 201a in a queue format.

Mini-stocker 208 receives FOUP 202b from loading port 201a and stores FOUP 202b waiting to be transferred to loading port 201b. FOUP 202b contains etched wafers. FOUP 202c is positioned at an input location of a cleaning chamber 210. Etched wafers stored in FOUP 202c at station 104c are transferred to cleaning chamber 210 where residual material from the etching process is cleaned from the etched wafers. Following the cleaning process, cleaned wafers are stored in FOUP 202d located at station 104d. Once FOUP 202d contains a specified number of wafers, the front opening door of the FOUP is closed and the FOUP is transported to another device. Empty FOUPs 202 from loading port 201b are transported to mini-stocker 206. Controller 212 is configured to monitor an elapsed time since a previous purge of etch of the FOUPs.

Loading port 201a includes four stations 104. Station 104a occupied by FOUP 202a does not include nozzle 106 because the FOUP stores unetched wafers which are at a low risk of damage due to moisture content in the FOUP. In some embodiments, loading port 201a only includes nozzle 106 at station 104b occupied by FOUP 202b. In some embodiments, all stations 104 of loading port 201a include nozzle 106. Controller 212, connected to loading port 201a, is configured to signal nozzle 106 to supply inert gas to purge the interior of FOUP 202b receiving etched wafers from etching chamber 204 if the front opening door of the FOUP is closed. By purging the interior of FOUP 202b if the door is closed, the moisture content in the FOUP is reduced immediately to minimize the risk of damage of the etched wafers.

Etching chamber 204 is configured to receive the wafer from FOUP 202a and etch either the wafer or layers formed on the wafer. The etching process forms features such as lines, vias, trenches or other suitable features in the wafer or layers formed on the wafer. In some embodiments, the etching process is a dry etching process. In some embodiments, the etchant is tetrafluoromethane. In some embodiments, the etchant includes oxygen ($O_2$), chlorine ($Cl_2$), boron trichloride ($BCl_3$), other fluorocarbons or other suitable etchants. The etching process leaves residual material on a surface of the wafer. The residual material includes unreacted etchant, etching by-products, particles of the etched material or other material. The residual material is potentially damaging to the wafer by either increasing the size of the features etched into the wafer or creating additional unintended features in the wafer. The etched wafers are subjected to the cleaning process to remove the residual material.

Mini-stocker 206 stores empty FOUPs 202 waiting to be transferred to loading port 201a. In some embodiments, mini-stocker 206 is integrated with loading port 201a. In some embodiments, mini-stocker 206 is omitted. In some embodiments, mini-stocker 206 includes nozzles 106 similar to loading port 201a. In some embodiments, mini-stocker 206 does not include nozzles 106. In some embodiments, loading port 201a and mini-stocker 206 share a common gas supply 108 (FIG. 1). In some embodiments, loading port 201a and mini-stocker 206 have separate gas supplies 108. FOUPs 202 stored in mini-stocker 206 do not contain wafers, so purging the interior of the FOUPs is not necessary. In some embodiments, empty FOUPs 202 are purged to reduce the moisture content within the FOUP prior to loading the wafers into the FOUP.

Mini-stocker 208 stores FOUPs 202b containing etched wafers to be transferred to loading port 201b. In some embodiments, mini-stocker 208 is integrated with loading port 201b. In some embodiments, mini-stocker 208 is omitted. In some embodiments, mini-stocker 208 includes nozzles 106 similar to loading port 201b. In some embodiments, mini-stocker 208 does not include nozzles 106. In some embodiments, loading port 201b and mini-stocker 208 share a common gas supply 108 (FIG. 1). In some embodiments, loading port 201b and mini-stocker 208 have separate inert gas supplies 108. Controller 212 connected to mini-stocker 208 is configured to signal nozzles 106 to supply inert gas to purge the interior of FOUPs 202b containing etched wafers based on a detected elapsed time and a position of the front opening door of the FOUP.

Loading port 201b holds FOUPs 202c containing etched wafers waiting to be cleaned in cleaning chamber 210. Loading port 201b includes four stations 104. In some embodiments, loading port 201b includes more or less than four stations 104. Station 104d occupied by FOUP 202d does not include nozzle 106 because the FOUP contains cleaned wafers which are not at risk of damage due to moisture content in the FOUP. The remaining stations 104 of loading port 201b comprise nozzles 106. In some embodiments, all stations 104 of loading port 201b include nozzle 106. Controller 212 connected to loading port 201b is configured to signal nozzle 106 to supply inert gas to purge the interior of FOUPs 202c containing etched wafers based on a detected elapsed time and a position of the FOUP front opening door.

Cleaning chamber 210 is configured to receive etched wafers from FOUP 202c located at station 104c and perform a cleaning process on the etched wafers. The cleaning process includes submersing the wafer in a cleaning solution. In some embodiments, the cleaning process includes rinsing the etched surface of the wafer with a cleaning solution or other suitable cleaning processes. The cleaning solution comprises deionized water. In some embodiments, the cleaning solution comprises ammonia hydroxide ($NH_4OH$), standard cleaning 1 (SC1), standard cleaning 2 (SC2) or other suitable cleaning solutions. The cleaning process lasts for a duration of about 30 seconds. In some embodiments, the duration of the cleaning process is more or less than 30 seconds depending on the time to sufficiently clean the wafer. If the duration of the cleaning process is too short, the wafer will not be sufficiently cleaned and the residual materials can still cause damage to the wafer. If the duration of the cleaning process is too long, the production yield is decreased based on reduced throughput. After the cleaning process is completed, cleaned wafers are transferred from cleaning chamber 210 to FOUP 202d located at station 104d. After FOUP 202d contains a specified number of wafers, the FOUP is transferred to another device for further processing.

In some embodiments, wafers are processed by system 200 in batches. In order to reduce exposure to moisture content, wafers are divided into sub-lots, in some embodiments. A number of sub-lots is predetermined to maximize efficient processing taking into consideration the elapsed time between wafer etching and wafer cleaning. A cycle through system 200 is now described using a twenty-five wafer batch and three sub-lots as an example. The number of wafers in a batch and the number of sub-lots is merely used for illustration; this disclosure encompasses within its scope embodiments having a different number of wafers in a batch and a different number of sub-lots.

FOUP 202a containing a full batch of twenty-five wafers is positioned in station 104a of loading port 201a adjacent etching chamber 204. The front opening door of FOUP 202a is opened and a robotic arm (not shown) transfers the wafers one at a time into etching chamber 204. The details of the robotic arm are not discussed in this description for the sake of brevity. A description of a suitable robotic arm is found in U.S. application Ser. No. 10/378,104, filed Feb. 27, 2003, which is incorporated herein by reference in its entirety. In some embodiments, etching chamber 204 processes more than one wafer at a time. After the wafers are etched, the robotic arm transfers the wafers to FOUP 202b at station 104b. FOUP 202b is considered full once either eight or nine etched wafers (twenty-five wafers divided into three sub-lots means two sub-lots of eight wafers and one sub-lot of nine wafers) are transferred into the FOUP. If FOUP 202b is full, the front opening door of the FOUP is closed and the interior is purged with inert gas.

FOUP 202b is then transported to mini-stocker 208. FOUP 202b is transported by an automated material handling system (AMHS). The AMHS vehicles carry FOUPs between tools that perform different processes. In some embodiments, the AMHS is manually controlled. In some embodiments, control of the AMHS is automated. In some embodiments, the tools are located in the same building. In some embodiments, the tools are located in separate buildings. Station 104b previously occupied by FOUP 202b, is filled by empty FOUP 202 and a different empty FOUP is transferred from mini-stocker 206 to loading port 201a. The etching, purging and transporting processes are repeated until the entire batch of etched wafers is located in mini-stocker 208. After FOUP 202a is emptied of wafers, the FOUP is transported to mini-stocker 206 to await transfer to loading port 201a.

While FOUPs 202b are held in mini-stocker 208, controller 212 monitors the elapsed time since the FOUP was purged. FOUPs 202b are transferred from mini-stocker 208 to loading port 201b. In some embodiments, FOUPs 202b are held in mini-stocker 208 until the entire batch, e.g., all three FOUPs, is present in mini-stocker 208. In some embodiments, FOUPs 202b are transferred from mini-stocker 208 to loading port 201b in a queue format without the entire batch being present in the mini-stocker.

FOUPS held in loading port 201b containing etched wafers waiting to be cleaned are labeled 202c. While FOUPs 202c are held in loading port 201b, controller 212 monitors the elapsed time since the FOUP was purged. Once FOUP 202c is in station 104c of loading port 201b adjacent cleaning chamber 210, the front opening door of the FOUP is opened. A robotic arm transfers the etched wafers one at a time to cleaning chamber 210. In some embodiments, cleaning chamber 210 is capable of cleaning more than one wafer at a time. The robotic arm transfers the cleaned wafers from cleaning chamber 210 to FOUP 202d located at station 104d. FOUP 202d contains cleaned wafers which are at a low risk of damage resulting from residual material on the wafer. After FOUP 202c is emptied of wafers, the FOUP is transferred to mini-stocker 206 to wait to be transferred to loading port 201a. FOUP 202d remains in station 104d until the entire batch of twenty-five wafers is transferred from cleaning chamber 210 to the FOUP. FOUP 202d is then transported to another tool for further processing.

The elapsed time since a last purge of each FOUP is monitored. In some embodiments, each of loading port 201a, loading port 201b and mini-stocker 208 has a separate controller. In some embodiments, a single controller 212 is configured to monitor system 200.

Figure 3A:
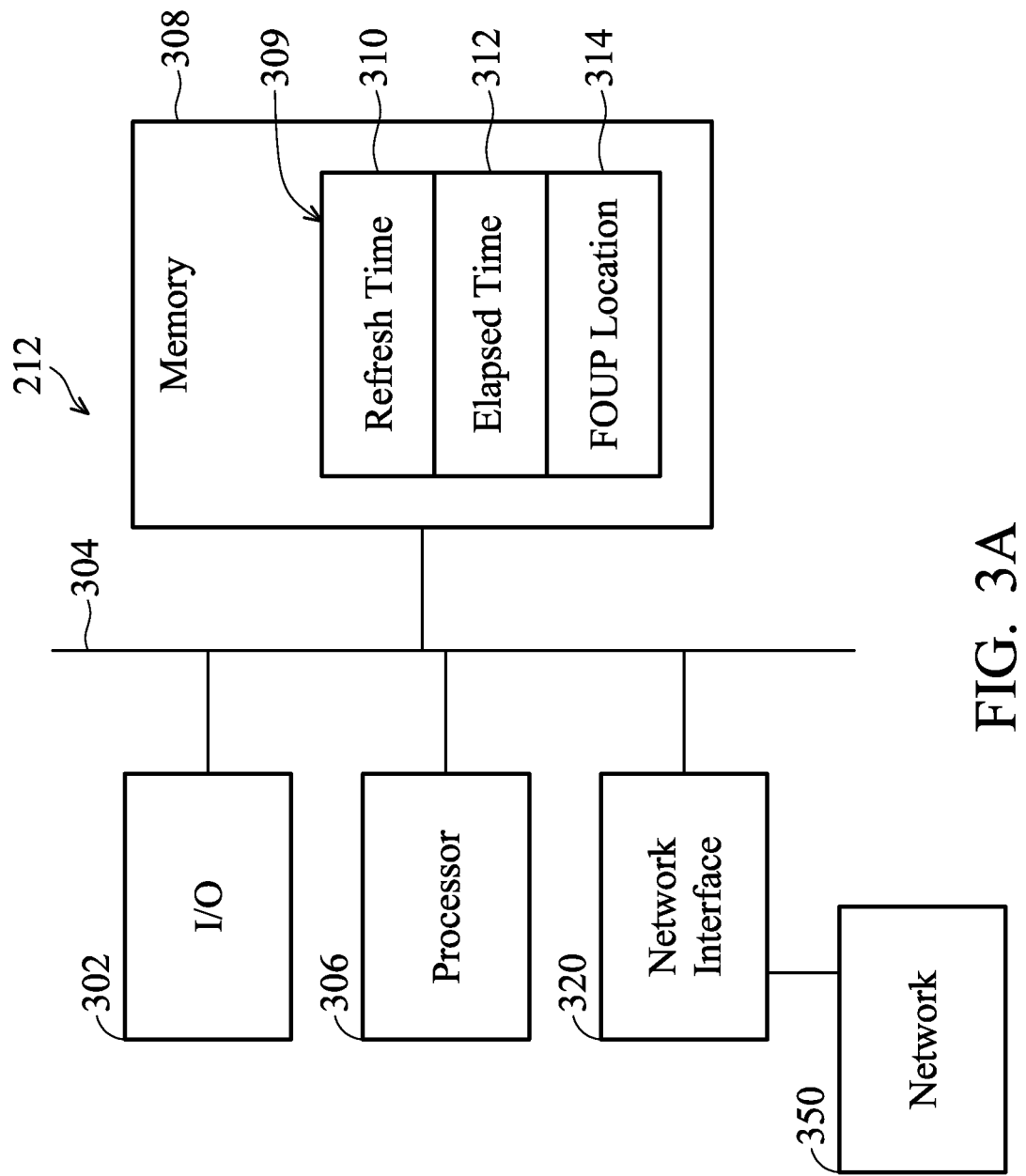
FIG. 3A is a block diagram of computer system for the controller in accordance with one or more embodiments.
Figure 3B:
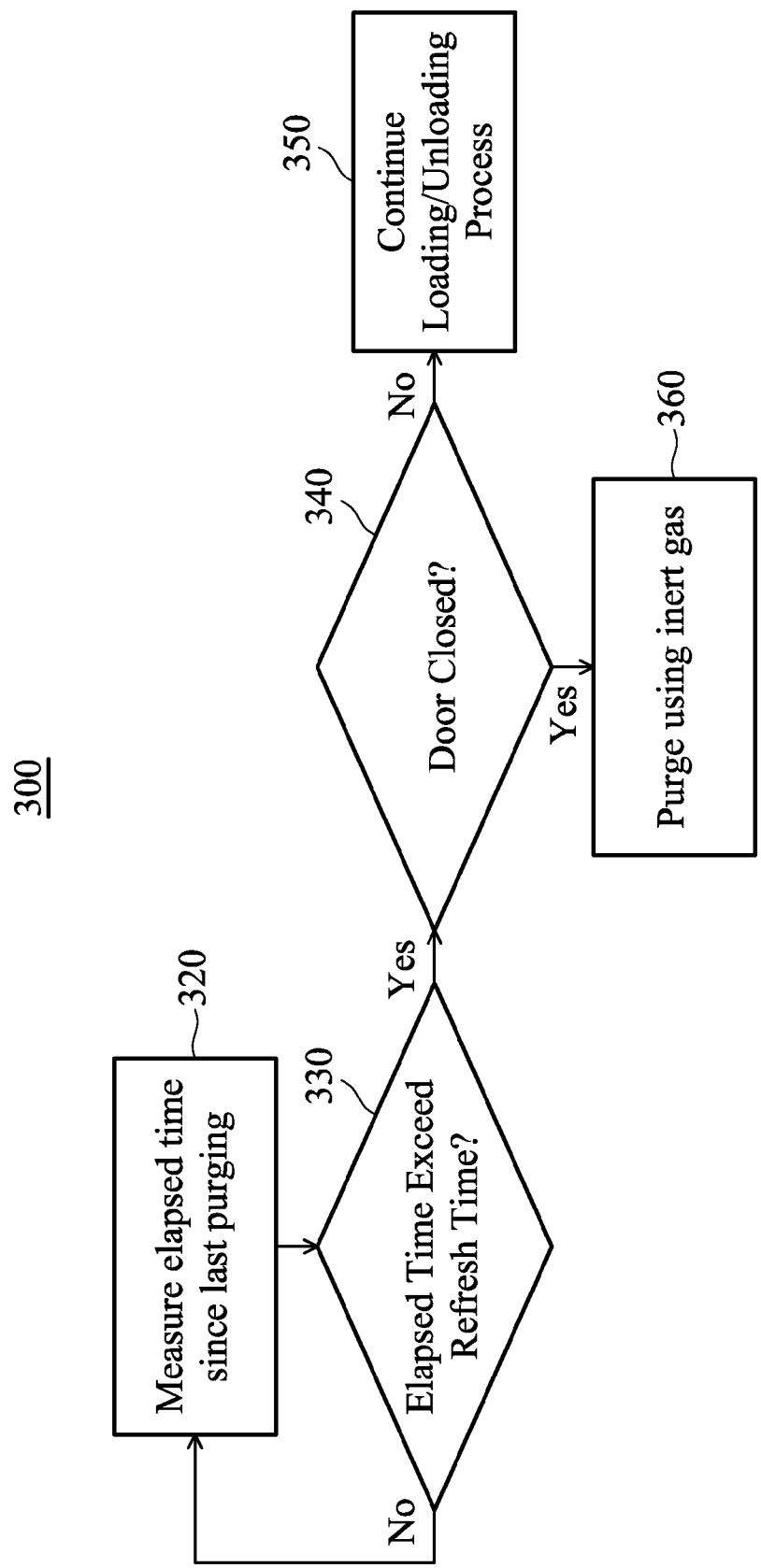
FIG. 3B is a process flow chart of operation of a controller for determining when to perform a purge process in accordance with one or more embodiments.

FIG. 3A is a block diagram of controller 212 usable for implementing the method disclosed in FIG. 3B in accordance with one or more embodiments. Controller 212 includes the hardware processor 306 and a non-transitory, computer readable storage medium 308 encoded with, i.e., storing, the computer program code 309, i.e., a set of executable instructions. The processor 306 is electrically coupled to the computer readable storage medium 308 via a bus 304. The processor 306 is configured to execute the computer program code 309 encoded in the computer readable storage medium 308 in order to cause controller 212 to be usable for performing a portion or all of the operations as depicted in FIG. 3B.

In some embodiments, the processor 306 is a central processing unit (CPU), a multi-processor, a distributed processing system, an application specific integrated circuit (ASIC), and/or a suitable processing unit.

In some embodiments, the computer readable storage medium 308 is an electronic, magnetic, optical, electromagnetic, infrared, and/or a semiconductor system (or apparatus or device). For example, the computer readable storage medium 308 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 820 includes a compact disk-read only memory (CD-ROM), a compact disk-read/write (CD-R/W), and/or a digital video disc (DVD).

In some embodiments, the storage medium 308 stores the computer program code 309 configured to cause controller 212 to perform a method as depicted in FIG. 3B. In some embodiments, the storage medium 308 also stores information needed for performing a method 300 or generated during performing the method 300, such as a refresh time parameter 310, an elapsed time parameter 312, a FOUP location parameter 314, and/or a set of executable instructions to perform the operation of FIG. 3B.

Controller 212 includes, in at least some embodiments, an input/output interface 302. The input/output interface 302 is coupled to external circuitry.

In at least some embodiments, controller 212 also includes a network interface 320 coupled to the processor 306. The network interface 320 allows controller 212 to communicate with a network 350, to which one or more other computer systems are connected. The network interface includes wireless network interfaces such as BLUETOOTH, WIFI, WIMAX, GPRS, or WCDMA; or wired network interface such as ETHERNET, USB, or IEEE-1394. In some embodiments, the method of FIG. 3B is implemented in two or more controllers 212, and information such as refresh time, elapsed time and/or FOUP location are exchanged between different controllers 212 via the network 350.

Controller 212 is configured to receive information related to a type of process through I/O 302. The information is transferred to processor 306 via bus 304 to determine a refresh time for the type of process. The refresh time is then stored in memory 308 as refresh time parameter 310. Controller 212 is configured to receive information related to FOUP locations through I/O 302. The information is stored in memory 308 as FOUP location parameter 314.

During operation, processor 306 executes a set of instructions to compare elapsed time parameter 312 to refresh time parameter 310. If the comparison indicates the elapsed time exceeds the refresh time, processor 306 generates a purge signal. Processor 306 determines a nozzle 106 (FIG. 1) to receive the purge signal based on FOUP location parameter 314. The purge signal is then transmitted to the determined nozzle 106 by I/O 302.

FIG. 3B is a flow chart a method 300 of operation of controller 212 controlling nozzles 106 to purge etched wafers store in FOUPs. In operation 320, the elapsed time since a last purge is measured. In some embodiments, the measurement is maintained as a continuous clock. In some embodiments, the measurement is maintained as a count-up timer or a count-down timer. In some embodiments, the measurement is taken periodically by separately identifying each FOUP and determining a previous purge time of each FOUP. In operation 330, the elapsed time is compared with a refresh time (310 in FIG. 3A). In some embodiments, the refresh time ranges from 2 hours to 3 hours. In some embodiments, the refresh time ranges from 1 hour to 8 hours. The refresh time (310 in FIG. 3A) is determined based on the etching process and the risk of damage to the wafers. Table 1 shows an example of the number of steps in a process having certain refresh times for manufacturing processes for different node size devices.

TABLE 1

| Refresh Time | N-Node | N + 1 Node | N + 2 Node (Low Power) | N + 2 Node (High Performance) |
|---|---|---|---|---|
| ≤2 hr | 3 | 2 | 7 | 7 |
| ≤4 hr | 15 | 25 | 25 | 28 |
| ≤8 hr | 60 | 101 | 103 | 106 |

As the node size decreases, the number of processing steps increases. Smaller node sizes also reduce refresh times because a smaller amount of damage to the wafer renders the wafer unusable. By purging the interior of the FOUPs in the loading ports and mini-stockers, the wafers can be held past the threshold time without reducing a yield of the production process.

Returning to FIG. 3B, if the elapsed time does not exceed the refresh time, as indicated by "No", method 300 returns to operation 320. If the elapsed time exceeds the refresh time, as indicated by "Yes", method 300 continues with operation 340. In operation 340, the controller determines whether the front opening door of the FOUP is closed. The front opening door of the FOUP remains closed, except when wafers are being loaded or unloaded from the FOUP. Purging the interior of the FOUP when the front opening door is open would not be effective because the inert gas would merely exit into the atmosphere surrounding the FOUP. If the door to the FOUP is closed, as indicated by "Yes", the interior of the FOUP is purged with inert gas in operation 350. If the door to the FOUP is open, as indicated by "No", the interior of the FOUP is not purged and the loading or unloading process is allowed to continue uninterrupted as indicated in operation 360. If the FOUP is being unloaded, there is no need to purge the FOUP following the unloading process because no wafers are contained within the FOUP. If the FOUP is being loaded, the FOUP is purged once the front opening door of the FOUP is closed and method 300 begins with operation 302.

Figure 4:
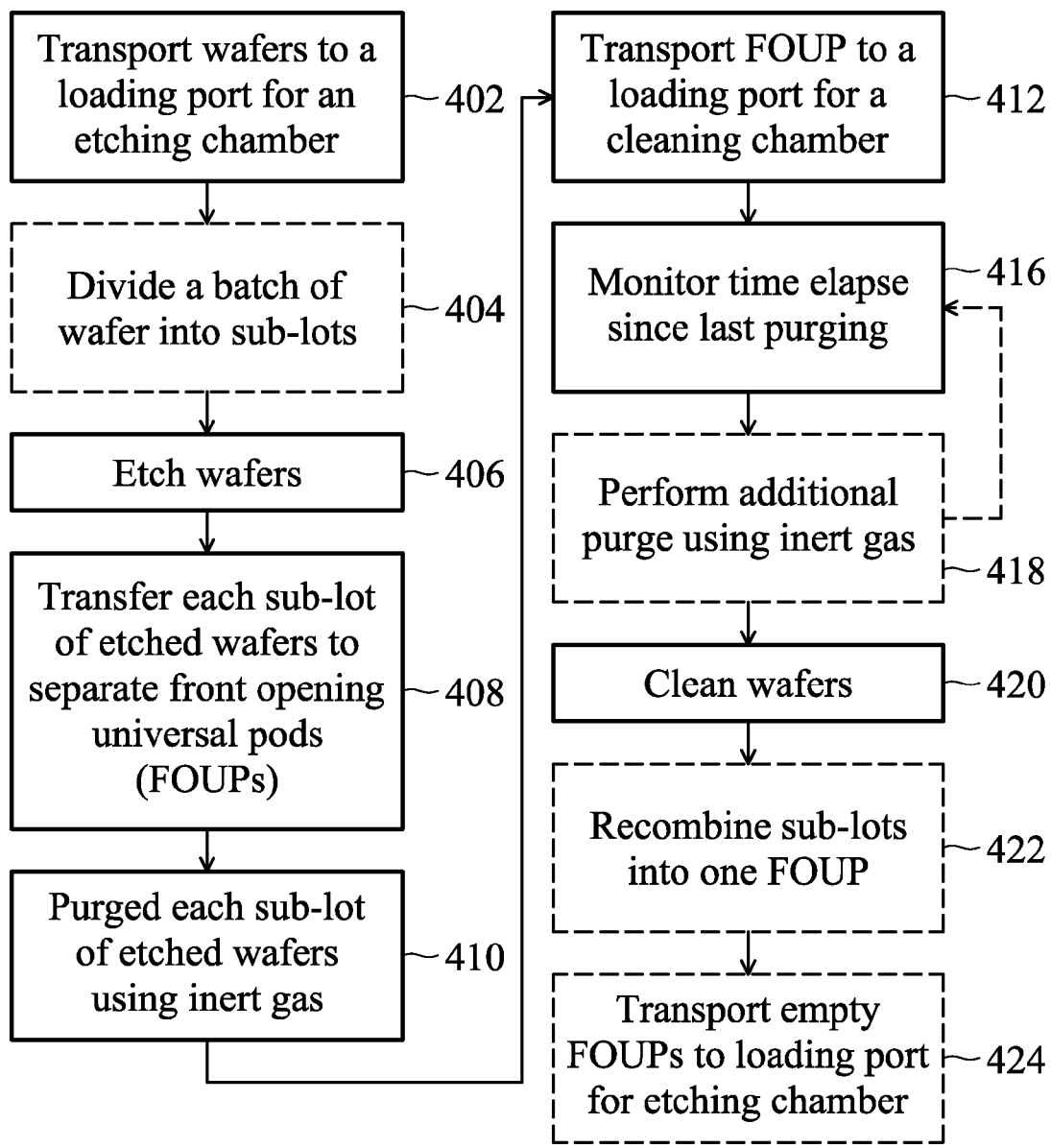
FIG. 4 is a flow chart of a method of using the system of FIG. 2 in accordance with one or more embodiments.

FIG. 4 is a flow chart of a method 400 of operating system 200. In operation 402, wafers are transported to a loading port for an etching chamber. In system 200, a batch of wafers is transported to loading port 201a in FOUP 202a. In operation 404, a batch of wafers is divided into sub-lots. In some embodiments, operation 404 is omitted and an entire batch of wafers is processed as a unit. In system 200, the batch of wafers in FOUP 202a is divided into several sub-lots. In operation 406, the wafers are etched. In system 200, etching chamber 204 performs the etching process. In operation 408, each sub-lot of wafers is transferred to a separate FOUP. In embodiments where the batch of wafers is processed as a unit, the entire batch of wafers is transferred into a single FOUP. In system 200, wafers are transferred from etching chamber 204 to FOUPs 202b. In operation 410, each sub-lot of etched wafers is purged using inert gas. In system 200, once the front opening door of FOUP 202b is closed, the interior of the FOUP is purged with inert gas.

In operation 412, the FOUP is transported to a loading port for a cleaning chamber. In system 200, FOUP 202b is transported from loading port 201a to mini-stocker 208 and then to loading port 201b. In operation 414, an elapsed time since a last purge of the FOUP is monitored. In system 200, controller 212 monitors the elapsed time. In operation 416, an additional purge of the FOUP using inert gas is performed. Operation 416 is performed based on method 300. In system 200, controller 212 determines whether to perform the additional purge. Once the additional purge is performed method 400 returns to operation 414. In some embodiments, additional purges are performed until method 400 continues to operation 418. In operation 418, the wafers are cleaned. In system 200, cleaning chamber 210 performs the cleaning of the wafers. In operation 420, the sub-lots of wafers are recombined into a single FOUP. In system 200, the sub-lots of wafers are recombined into FOUP 202d. In embodiments where the batch of wafers is processed as a unit, operation 420 is omitted. In operation 422, empty FOUPs are transported to the loading port for the etching chamber. In some embodiments, operation 422 is omitted and an empty FOUP is transported to a location other than the loading port for the etching chamber. In system 200, empty FOUPs are transported to mini-stocker 206 to be transported to loading port 201a.

The loading port, system and method described above provides an advantage over existing approaches by reducing the risk of damage to wafer due to the flexibility of performing additional inert gas purges without requiring transporting FOUPs containing etched wafers to a separate purging tool. As discussed above, different processing tools are located a considerable distance from one another. The large distance between the tools requires a significant amount of time and energy be consumed to transport the FOUPs to and from these tools. In addition, the time consumed by performing additional purges for certain FOUPs delays initial purges for other FOUPs which increases the risk of damage to wafers. It was found that by incorporating the features described above, productivity of a process using wafers having a diameter of 450 millimeters (mm) increased by approximately 7%. The increased productivity leads to an increase in profit because less material is wasted due to irreparable damage.

As indicated by the information shown in Table 1, as technology nodes decrease in size the number of processing steps requiring a shorter threshold time increases. The above described approach provides the ability to perform additional purges to allow additional time between processing steps. The additional time between processing steps enables the semiconductor device to be completed without the need for constructing duplicate tools to handle the processing requirements for the smaller node devices.

As technology nodes shrink, wafer and layer materials are shifting away from conventional semiconductor materials to include more polymer type materials. In some instances, the polymer materials are more susceptible to damage from the residual material. The ability to perform additional purges at numerous points throughout the process enables changing from conventional semiconductor materials to polymer type materials while avoiding a need to redesign an entire production process to compensate for shorter threshold times.

One aspect of this description relates to a loading port. The loading port includes a housing and a plurality of stations defined in the housing configured to receive a front opening universal pod (FOUP). The loading port further includes a connector configured to receive an inert gas. At least one of the plurality of stations is configured to deliver the inert gas to the FOUP to purge an interior of the FOUP of moisture.

Another aspect of this description relates to a wafer processing system. The wafer processing system includes a first loading port. The first loading port includes a first housing and a first plurality of stations defined in the first housing configured to receive a front opening universal pod (FOUP). The first loading port further includes a first connector configured to receive an inert gas. At least one of the first plurality of stations is configured to deliver the inert gas to the FOUP to purge an interior of the FOUP of moisture. The wafer processing system further includes an etching chamber configured to perform an etching process on a wafer. The wafer processing system further includes a second loading port. The second loading port includes a second housing and a second plurality of stations defined in the second housing configured to receive the FOUP. The second loading port includes a second connector configured to receive the inert gas. At least one of the second plurality of stations is configured to deliver the inert gas to the FOUP to purge an interior of the FOUP of moisture. The wafer processing system further includes a cleaning chamber configured to perform a cleaning process on the wafer.

Still another aspect of this description relates to a method of operating a wafer processing system. The method includes etching a batch of wafers and transferring at least a portion of the batch of wafers to a first front opening universal pod (FOUP) received in a first loading port. The method further includes purging an interior of the first FOUP with an inert gas while the first FOUP is received in the first loading port. The method further includes transporting the first FOUP to a second loading port. The method further includes monitoring an elapsed time from the purging and performing a second purging of the interior of the first FOUP if the elapsed time exceeds a threshold time. The method further includes cleaning the batch of wafers.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A loading port comprising:
   a housing;
   a plurality of stations defined in the housing configured to receive a front opening universal pod (FOUP), the FOUP comprising a door configured to be in one of an open position or a closed position;
   a connector configured to receive an inert gas;
   a nozzle in at least one of the plurality of stations, the nozzle being configured to convey the inert gas from the connector to the FOUP to purge an interior of the FOUP of moisture; and
   a controller configured to (1) control the nozzle to regulate flow of the inert gas, (2) determine a time duration following a purge, (3) compare the determined time duration with a predetermined threshold, (4) determine if the door of the FOUP is in the open or the closed position, (5) actuate the nozzle to allow the inert gas to flow into the FOUP if the measured time exceeds the predetermined threshold and the door of the FOUP is in the closed position, and (6) prevent actuation of the nozzle if the door of the FOUP is in the open position,
   wherein the door of the FOUP is configured to be closed based on a predetermined quantity of wafers contained within the FOUP.

2. The loading port of claim 1, wherein the inert gas is nitrogen gas.

3. The loading port of claim 1, wherein each of the plurality of stations is configured to deliver the inert gas to the FOUP.

4. The loading port of claim 1, wherein the time duration is determined while the FOUP is occupied by one or more wafers.

5. The loading port of claim 1, wherein the predetermined quantity of wafers is zero.

6. The loading port of claim 1, wherein the predetermined quantity of wafers is a number greater than zero.

7. A wafer processing system comprising:
a first loading port, the first loading port comprising:
a first housing;
a first plurality of stations defined in the first housing configured to receive a front opening universal pod (FOUP), the FOUP comprising a door configured to be in one of an open position or a closed position;
a first connector configured to receive an inert gas; and
a first nozzle in at least one of the first plurality of stations, the first nozzle being configured to convey the inert gas from the first connector to the FOUP to purge an interior of the FOUP of moisture;
an etching chamber configured to perform an etching process on a wafer;
a second loading port, the second loading port comprising:
a second housing;
a second plurality of stations defined in the second housing configured to receive the FOUP;
a second connector configured to receive the inert gas; and
a second nozzle in at least one of the second plurality of stations, the second nozzle being configured to convey the inert gas from the second connector to the FOUP to purge the interior of the FOUP of moisture;
a cleaning chamber configured to perform a cleaning process on the wafer; and
a controller configured to (1) control the first nozzle and the second nozzle to regulate flow of the inert gas, (2) determine a time duration following a first purge, (3) compare the determined time duration with a predetermined threshold, (4) determine if the door of the FOUP is in the open or the closed position, (5) actuate the first nozzle or the second nozzle to allow the inert gas to flow into the FOUP to perform a second purge if the determined time exceeds the predetermined threshold and the door of the FOUP is in the closed position, and (6) prevent actuation of the nozzle if the door of the FOUP is in the open position,
wherein the door of the FOUP is configured to be closed based on a predetermined quantity of wafers contained within the FOUP.

8. The system of claim 7, wherein the inert gas is nitrogen gas.

9. The system of claim 7, further comprising
a first mini-stocker, the first mini-stocker comprising:
a third housing,
a third plurality of stations defined in the third housing configured to receive the FOUP; and
a second mini-stocker, the second mini-stocker comprising:
a fourth housing,
a fourth plurality of stations defined in the fourth housing configured to receive the FOUP, and
a third connector configured to receive the inert gas,
wherein at least one of the fourth plurality of stations is configured to deliver the inert gas from the third connector to the FOUP to purge an interior of the FOUP of moisture.

10. The system of claim 9, wherein at least one of the fourth plurality of stations each comprises a corresponding nozzle, the corresponding nozzle is configured to regulate flow of the inert gas into the FOUP.

11. The system of claim 10, wherein the controller is further configured to control each of the first nozzle, the second nozzle and the corresponding nozzle to regulate flow of the inert gas to the FOUP.

12. The system of claim 7, wherein the etching chamber is configured to perform a dry etching process.

13. The system of claim 7, wherein the cleaning chamber is configured to perform a wet cleaning process.

14. The system of claim 7, wherein the time duration is determined while the FOUP is occupied by one or more wafers.

15. An apparatus comprising:
a processor; and
a non-transitory computer readable medium connected to the processor, the non-transitory computer readable medium configured to store computer program code, the computer program code configured to, with the processor, cause the apparatus to:
determine a time duration following a purge of a front opening universal pod (FOUP);
compare the determined time duration with a predetermined threshold;
determine if a door of the FOUP is in an open or a closed position;
actuate a nozzle to allow an inert gas to flow into the FOUP if the determined time duration exceeds the predetermined threshold and the door of the FOUP is in the closed position; and
prevent actuation of the nozzle if the door of the FOUP is in the open position, wherein the door of the FOUP is configured to be closed based on a predetermined quantity of wafers contained within the FOUP.

16. The apparatus of claim 15, wherein the computer program code is further configured to cause the apparatus to determine a transition of a door of the FOUP from the open position to the closed position.

17. The apparatus of claim 16, wherein the computer program code is further configured to cause the apparatus to actuate the nozzle to allow the inert gas to flow into the FOUP upon determining the transition of the door of the FOUP from the open position to the closed position.

18. The apparatus of claim 15, wherein the computer program code is further configured to cause the apparatus to determine a position of a FOUP in a wafer processing system.

19. The apparatus of claim 15, wherein the computer program code is further configured to cause the apparatus to actuate the nozzle to allow the inert gas to flow into the FOUP based on the determined position of the FOUP.

20. The apparatus of claim 15, further comprising a network interface connected to the processor, the network interface configured to receive and transmit information related to at least one of FOUP location, the predetermined threshold or the determined time duration.

* * * * *